United States Patent [19]

Steube

[11] 4,116,161
[45] Sep. 26, 1978

[54] DUAL TUMBLING BARREL PLATING APPARATUS

[75] Inventor: Kenneth E. Steube, St. Charles, Mo.

[73] Assignee: McDonnell Douglas Corporation, Long Beach, Calif.

[21] Appl. No.: 741,307

[22] Filed: Nov. 12, 1976

[51] Int. Cl.² ............................................. C23C 13/08
[52] U.S. Cl. .................................. 118/49.1; 118/418
[58] Field of Search ................. 118/49.1, 49.5, 48, 118/49, 417, 418

[56] References Cited

U.S. PATENT DOCUMENTS

| 3,201,273 | 8/1965 | Maker et al. | 118/418 X |
| 3,213,827 | 10/1965 | Jenkin | 118/49.5 |
| 3,307,515 | 3/1967 | Wiener et al. | 118/418 X |
| 3,517,644 | 6/1970 | Baer | 118/418 X |
| 3,750,623 | 8/1973 | Carpenter et al. | 118/49.5 |
| 3,845,739 | 11/1974 | Erhart et al. | 118/49.1 |
| 3,926,147 | 12/1975 | Steube | 118/49.1 |

Primary Examiner—Wm. Carter Reynolds
Attorney, Agent, or Firm—George W. Finch; Walter J. Jason; Donald L. Royer

[57] ABSTRACT

An apparatus for plating work pieces including irregularly-shaped workpieces of various sizes with a technique known as ion vapor deposition wherein the articles are tumbled in adjacent counter-rotating barrels, a portion of which are cathodes of a high voltage system. The barrels rotate about generally horizontal axes toward anodes positioned therebetween which supply evaporated plating material.

7 Claims, 6 Drawing Figures

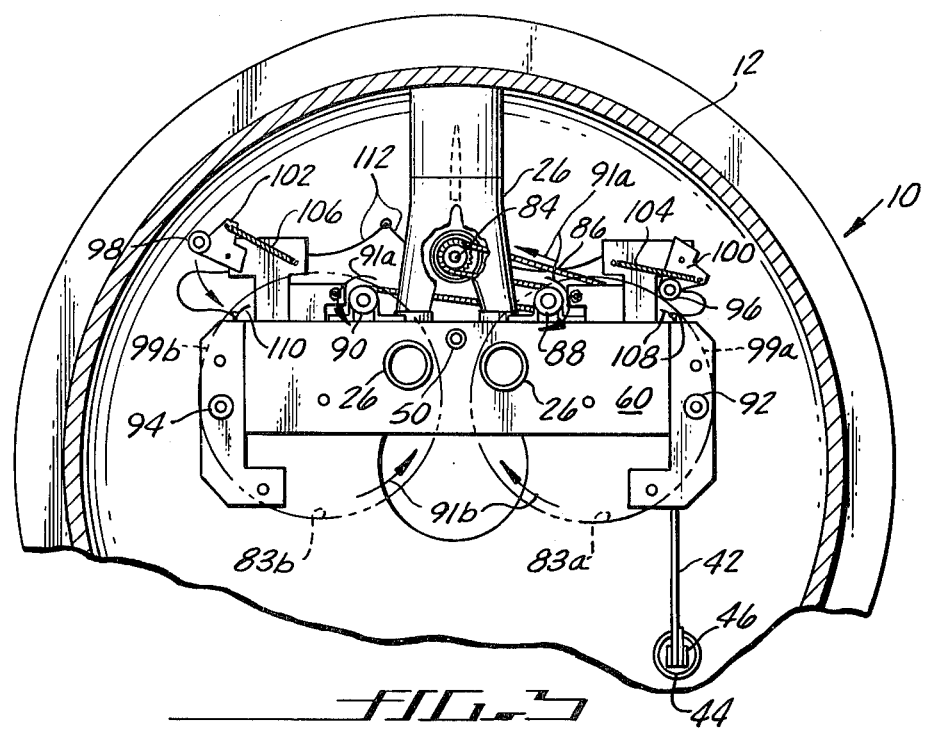
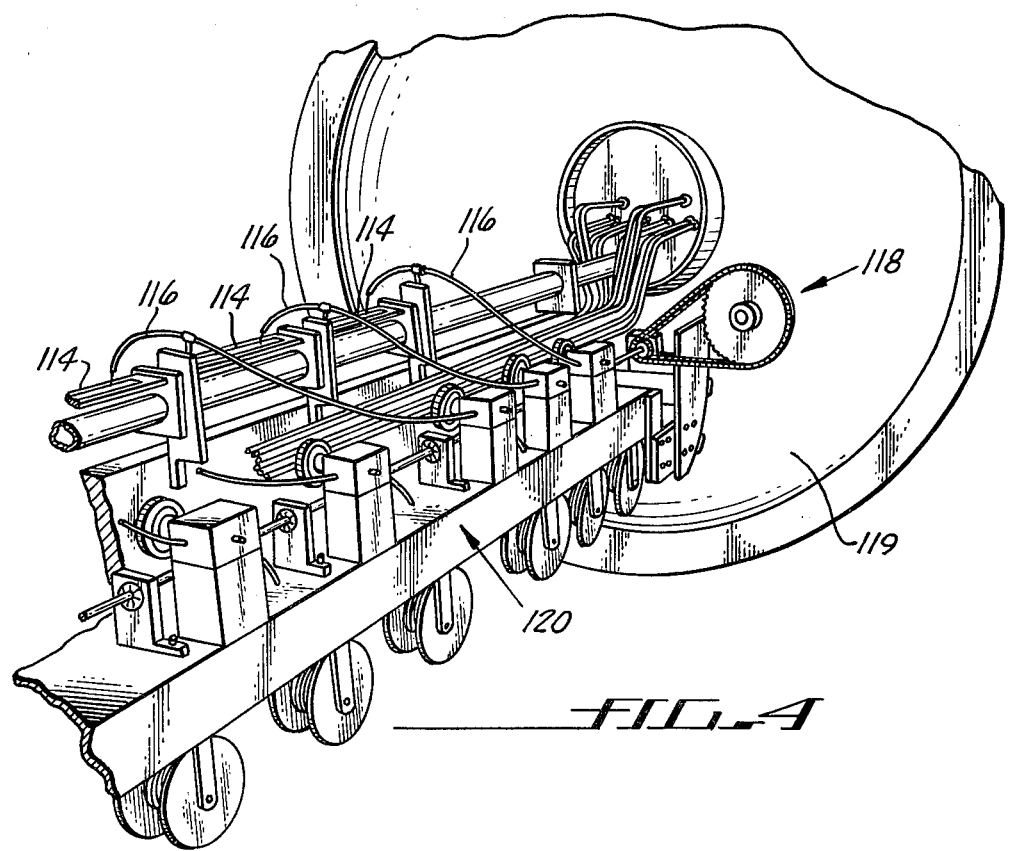

DUAL TUMBLING BARREL PLATING APPARATUS

CROSS REFERENCE TO RELATED PATENT AND APPLICATION

The invention described herein is related to U.S. Pat. No. 3,750,623 which issued 7 Aug. 1973, to Carpenter et al. and is assigned to applicant's assignee. The invention is also an improvement to the device described in U.S. Pat. No. 3,926,147 which issued 16 Dec., 1975 to K. E. Steube entitled "Glow Discharge Tumbling Vapor Deposition Apparatus." All the information contained in the above-identified patents is incorporated by reference in the specification as though fully set forth herein below.

BACKGROUND OF THE INVENTION

Many attempts have been made, many devices have been constructed, and many techniques have been used to plate articles that are to be exposed to environmental conditions such as high temperatures and corrosive atmospheres. The protection of such articles becomes especially critical when they are the parts used on the surfaces of components of spaced vehicles, aircraft, and other similar devices which may be exposed to the unfavorable environmental conditions because corrosion tends to damage or destroy the operating effectiveness of such devices and causes costly and tragic failures. It also has been desired to accurately and uniformly plate such workpieces with protective material without substantially changing their size, shape or dimensions and without weakening them.

There are many known and available plating apparatus and processes which have been used to protect parts from the effects of corrosion. However, most known processes create environmental problems that are becoming almost prohibitively expensive to solve, especially as local and national laws are becoming more strict. Those processes, such as ion vapor deposition, which do not create environmental problems like common cadmium plating processes do have been unable to mass plate articles in sufficient quantities to be economically practical.

The plating apparatus described in the Steube patent referenced above, is an attempt to solve the mass plating problem primarily with ion vapor deposition. The basic process of ion vapor deposition is well known and was reported in the U.S.A. as nearly as November, 1963, by D. M. Maddox in a paper entitled "Film Deposition Using Accelerated Ions" in Sandia Corporation Development Report No. SC-DR-281-63.

In the known ion vapor deposition process, the workpiece to be plated is connected so that it is the cathode of a high voltage direct current glow discharge circuit which is operated within a vacuum chamber at low pressures in the presence of an inert gas. When the high voltage is applied, a glow discharge is established about the workpiece which is at the opposite potential from an evaporator boat containing the plating material. Some of the inert gas is ionized and accelerated toward the workpiece striking the workpiece with relatively high energy. This provides some cleaning of the workpiece surface. Once the inert gas bombardment has cleaned the surface of the workpiece to be plated, the temperature of the plating material is increased until it begins to evaporate. A portion of the evaporated plating material is ionized in the glow discharge region and accelerated toward the workpiece by the applied DC potential. Collisions between inert gas molecules and evaporant molecules also cause evaporant molecules to be directed toward the workpiece and to be deposited. The inert gas bombardment of the workpiece continues during the deposition and the rate of evaporation of the plating material from the boat is increased until the plating rate exceeds the rate at which material is being removed from the workpiece by the inert gas bombardment. The continued glow discharge cleaning of the workpiece and the high impact energies of the plating material ions give excellent coating adhesion and a good protective coating.

Although the presence of the inert gas increases the throwing power of the evaporated plating material so that it attempts to accumulate on all sides of an article to be plated, a more uniform plating layer having good adhesion characteristics can be acquired by use of a device such as that described in the above-referenced Steube patent. In that apparatus, a horizontally rotating barrel cathode is used to tumble the workpieces therein while they are being subjected to both cleaning and plating in the glow discharge. The tumbling action of the barrel, however, carries the workpieces a substantial distance up one side of the barrel, but still in the glow discharge region before they tumble back toward the bottom. This tends to move them in and out of the area of the barrel cathode closest to the evaporator boats. Heretofore the evaporator boats have been located directly below the rotating barrel. The evaporator boats are open on top and gravity is used to restrain the molten plating material in the boat. Any side positioning of the boat with respect to the barrel tends to enable the evaporated plating material to escape from the glow discharge. Therefore, it has been desired to create an apparatus wherein the workpieces remain in the desired area of the glow discharge while the source of evaporated plating material is in close proximity thereto.

BRIEF DESCRIPTION OF THE PRESENT INVENTION

The present invention solves the problems related to the inventor's previous invention for mass ion vapor deposition of plating material upon irregularly shaped work-pieces of varying sizes by providing at least two adjacent counter-rotating mesh barrels which act as cathodes in a gas glow discharge. The anode which is comprised of one or more plating material evaporating boats is located outside but adjacent to the lower facing quadrants of both barrels which rotate so that the workpieces therein tend to tumble on the barrel walls near the evaporator boats. This causes a large percentage of the evaporated plating material to eventually plate the workpiece. Shields are provided both within and outside the barrels to reduce the area of the glow discharge to the desired plating area where the parts tend to tumble. The shields also prevent undesirable electrostatic fields which would cause strong beams of electrons to be accelerated out along the horizontal axes thereof. Such electron beams tend to overheat or burn the vacuum chamber in which the apparatus must be located and, at the same time, the formation of nonproductive electron beams wastes electric power.

It is, therefore, a principal object of the present invention to provide an improved apparatus for ion vapor deposition of plating material on small articles.

Another object is to provide an ion vapor deposition apparatus which is relatively economical to build, operate and maintain.

Another object is to provide an ion vapor deposition apparatus which can be operated to batch plate or to plate a continuous supply of articles as they pass through the plating apparatus.

Another object is to reduce the cost of plating articles and to make the plating process more efficient, less expensive and less time-consuming.

Another object is to provide an apparatus for plating corrosion-sensitive parts which does not pollute the atmosphere or local water supplies.

Another object is to teach the construction and operation of a novel open mesh double counter-rotating barrel construction for use in a plating device.

Another object is to establish an ion glow discharge in adjacent portions only of adjacent counter-rotating open mesh barrels in which parts are tumbled during a plating operation.

Another object is to provide a more efficient mass production plating apparatus and process which, although primarily designed to use ion vapor deposition techniques, can be used with physical vapor deposition and chemical vapor deposition techniques.

Another object is to provide a plating apparatus which can be operated by using many different plating substances including relatively inexpensive plating substances thereby further reducing the cost of plating articles while achieving superior plating characteristics therefor.

Another object is to provide means for more uniformly and accurately plating all surfaces of articles including surfaces on regular, as well as on irregularly shaped articles.

Another object is to provide an improved bond between substrates and plating layers applied thereto.

Another object is to provide improved means for surface plating metallic as well as non-metallic workpieces.

Another object is to minimize the labor required to plate objects.

These and other objects and advantages of the present invention will become apparent to those skilled in the art after considering the following detailed specification which discloses a preferred embodiment thereof in conjunction with the accompanying drawings wherein:

BRIEF DESCRIPTION OF THE DRAWINGS

FIG. 3 is a partial cross-sectional end view looking in the direction of arrows 3—3 of FIG. 1.

FIG. 4 is a partial perspective view of the left end of FIG. 1 showing the connected plating material supplies and power connections.

DETAILED DESCRIPTION OF THE PRESENT EMBODIMENT

Figure 1:
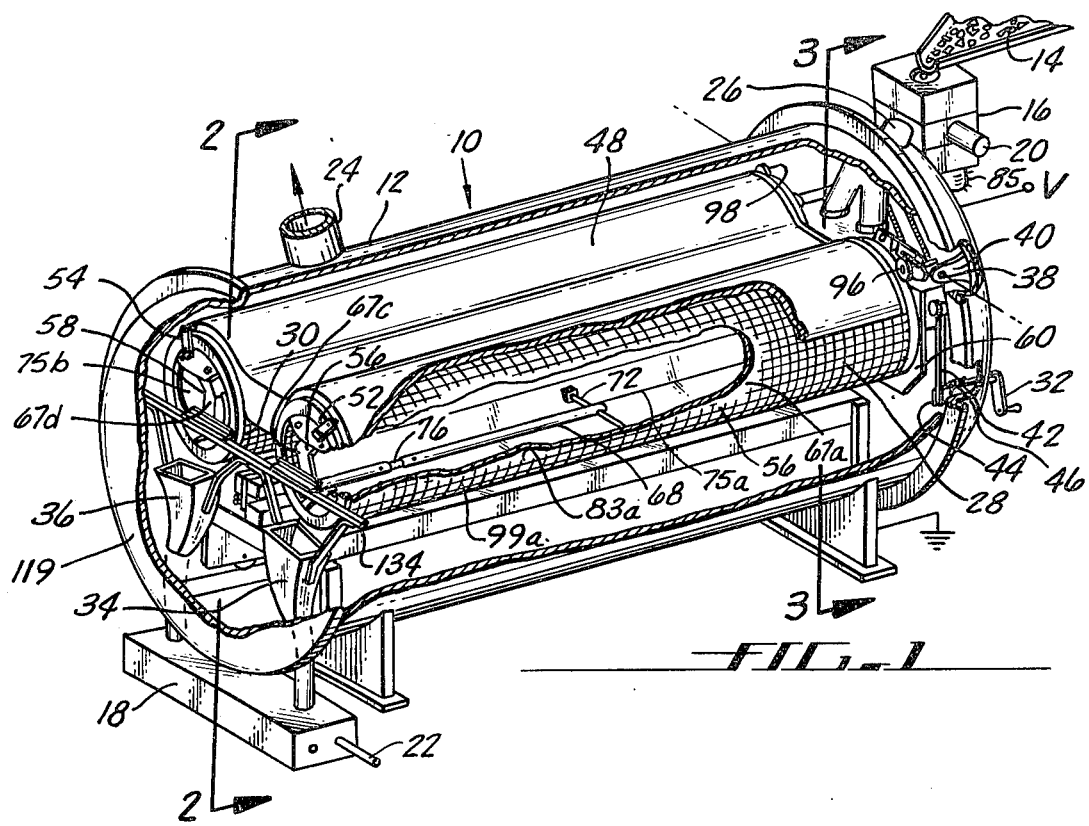
FIG. 1 is a partially cutaway perspective view of a plating apparatus including the features of the present invention.

Referring to the drawings more particularly by reference numbers, number 10 in FIG. 1 refers to a double barrel plating apparatus constructed according to the present invention. The apparatus includes a vacuum chamber 12 into which workpieces 14 can be fed and removed by suitable vacuum lock means 16 and 18. The vacuum locks 16 and 18 and main chamber 12 are connected to a source of vacuum by conduits 20, 22 and 24 respectively, the source of the vacuum not being shown. The workpieces 14 to be plated are fed through the vacuum lock 16, are divided by a suitably bifurcated chute 26 and fall into the interiors of a pair of generally parallel counterrotating open mesh barrels 28 and 30, which act as cathodes in a glow discharge as will be explained hereinafter. The workpieces 14 are tumbled in the barrels 28 and 30 while they are being subjected to an ion vapor deposition process. The barrels 28 and 30 whose axes are normally perpendicular to the force of gravity, are then allowed to tilt by rotation of handle 32, so that the workpieces 14 tumble out into output chutes 34 and 36 and into lock hopper 18. The tilting can be accomplished because the barrels 28 and 30 and their supported elements and shields, to be discussed later, are supported for rotation at pivot line 38 by suitable hinge members 40, one of which being shown, and a lever arm 42 operatively connected to the barrels 28 and 30 as discussed hereinafter whose opposite end 44 is attached to a jack screw 46 operated by the handle 32.

Figure 2:
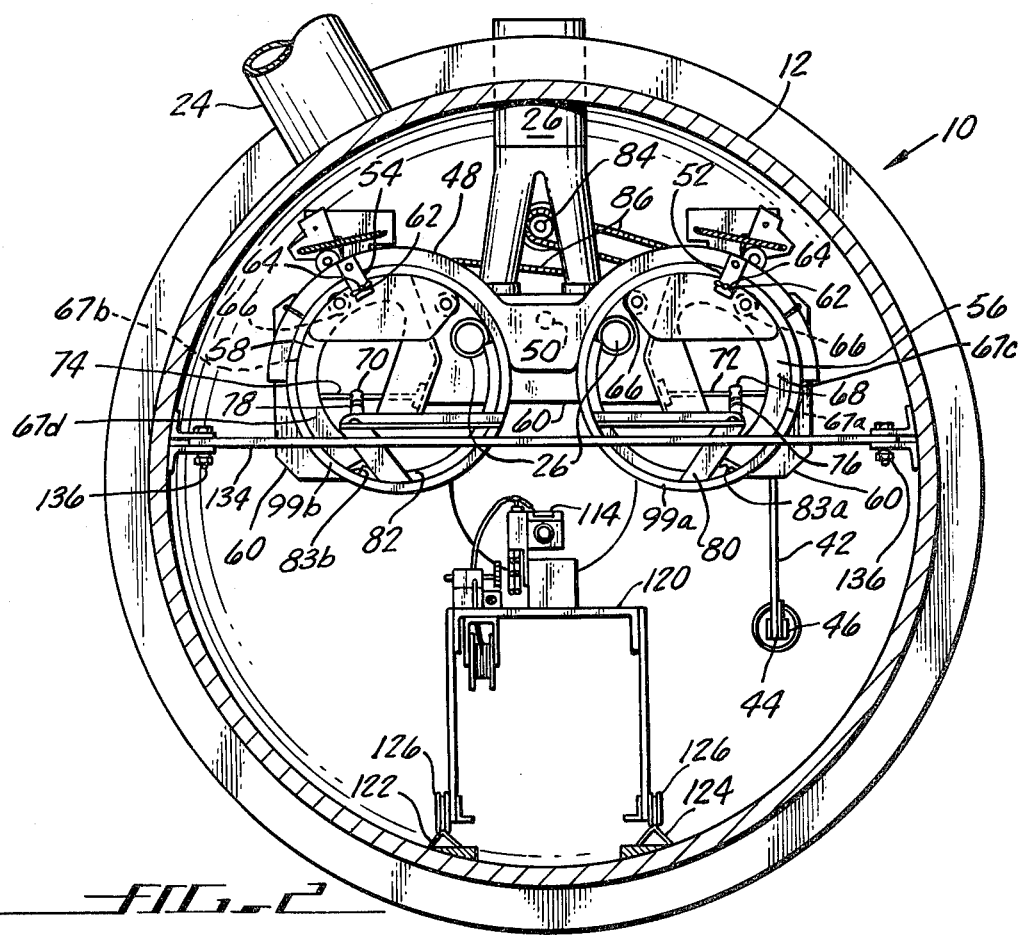
FIG. 2 is a cross-sectional view of FIG. 1 looking in the direction of arrows 2—2.
Figure 5:
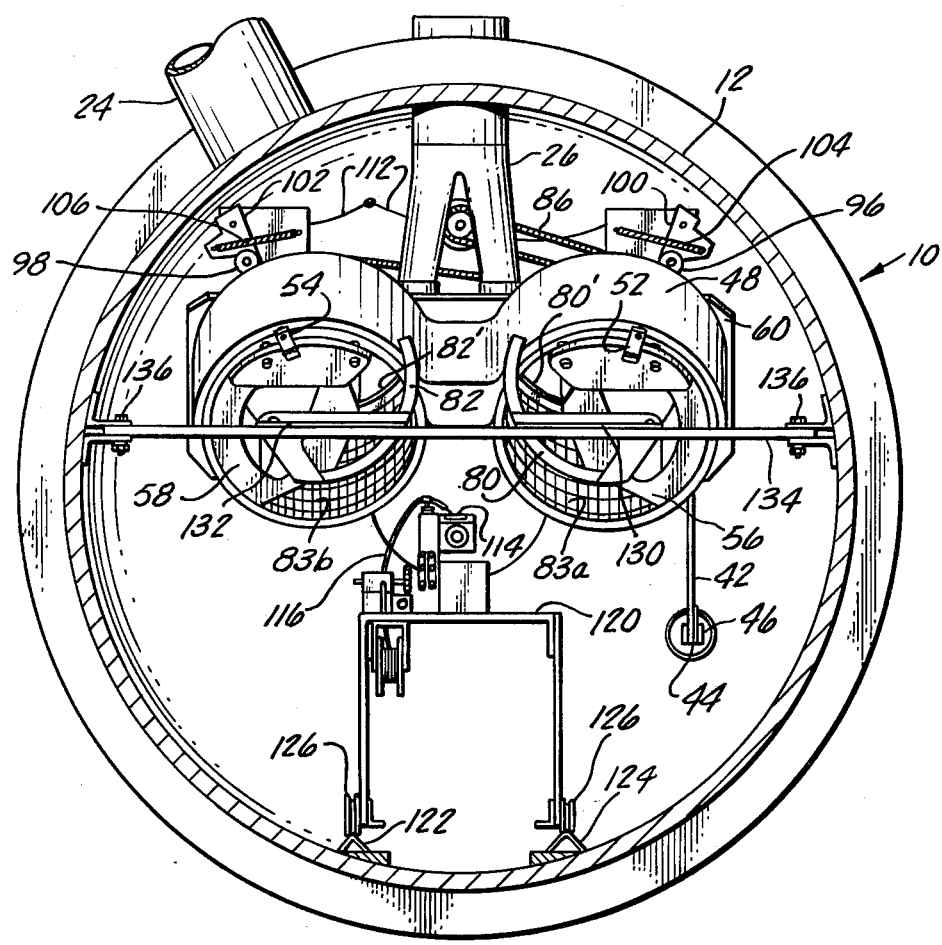
FIG. 5 is a view similar to FIG. 2 wherein the barrels of the present apparatus have been tilted for unloading.
Figure 6:
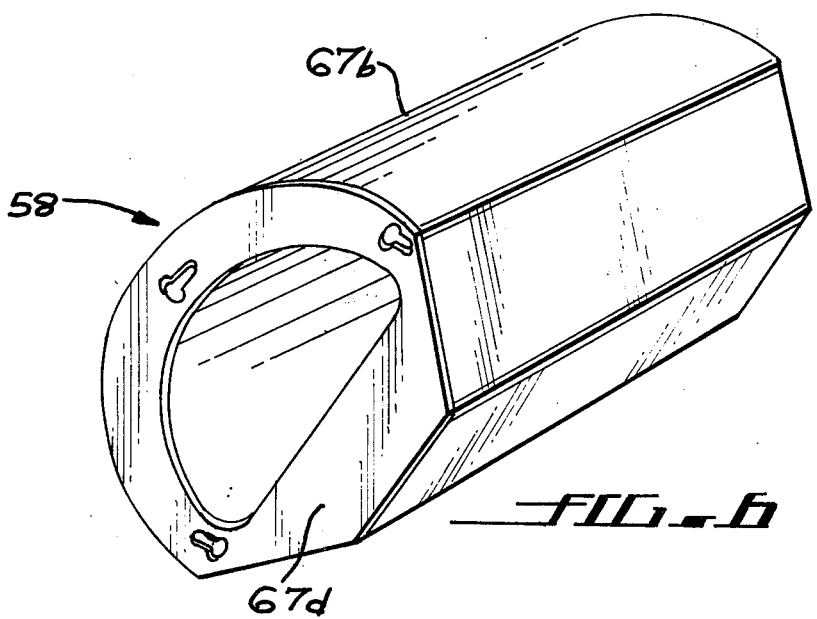
FIG. 6 is an isometric view of one of the inner shields of the present apparatus.

As can be seen in FIGS. 1, 2 and 5, the barrels 28 and 30 are partially surrounded by an external shield 48 which covers the upper portions of both barrels 28 and 30. The shield 48 is supported away from the barrels at its inner end by means of a pin 50 (FIGS. 2 and 3) which extends sidewardly from a support plate 60 and at its outer end by end support members 52 and 54 which are permanently connected to the outer shield and releasably connected beyond the ends of the barrels to the inner shields 56 and 58 of the barrels 28 and 30 in positions to clear the barrels 28 and 30 rotation. The inner shields 56 and 58 are connected to the support plate 60 so that they extend sidewardly therefrom in the fashion of a cantilever. The plate 60 is connected for rotation about the hinge members 40 at pivot line 38 and therefor the inner shields 56 and 58 tilt therewith. The outer shield is released by the removal of wing nuts 62 from bolts 64 connected to the inner shields 56 and 58 which pass through holes (not shown) in the support members 52 and 54.

The inner shields 56 and 58 include insulated rollers at their opposite ends on which the barrels 28 and 30 are supported for rotation, rollers 66 being shown in FIG. 2. The shields 48, 56 and 58 are all grounded and positioned with respect to the barrels 28 and 30 so as to allow the glow discharge region to be concentrated in the vicinity of the tumbling parts. Another advantage is that the shields 56 and 58 prevent an accumulation of electrons from forming on the center axes; of the barrels 28 and 30 which would be accelerated along the horizontal axis and impinge on the chamber wall. The inner shields 56 and 58 have continuous outer surfaces which define side shield surfaces 67a and 67b as shown. Their outlet ends 67c and 67d, however, define openings to allow passage therethrough of rods 68 and 70, which are pivoted by means of cross members 72 and 74 to the inner solid surfaces 75a and 75b of the shields 56 and 58 respectively. The rods 68 and 70 include insulating portions 76 and 78 therealong since the outermost ends of the rods 68 and 70 are connected to retainers 80 and 82 which ride on the inner surfaces 83a and 83b of the barrels 28 and 30 and prevent parts 14 from undesirably escaping out of the outlet ends thereof. Since the shields 56 and 58 to which the rods 68 and 70 are connected are grounded and the barrels 28 and 30 are normally at a high potential when the ion vapor deposition process is taking place, the insulating portions 76 and 78 prevent shorting of the high potential to ground. Similar retainers 80' and 82' insulated and fastened to the inner shields 56 and 58 can also be provided (FIG. 5) to prevent the escape of parts from the inlet ends of the barrels 28 and 30.

The barrels 28 and 30 are counter-rotated by means of a motor 85, the drive shaft 84 of which is shown in FIG. 2, and a suitable chain drive 86 which rotates insulated drive rollers 88 and 90 in the direction shown by arrows 91a in FIG. 3 to rotate the barrels 28 and 30 in the directions shown by arrows 91b. The drive rollers 88 and 90 are positioned to bear on the inner surfaces 83a and 83b of the barrel 28 and 30 as do insulated idler rollers 92 and 94 respectively. Insulated retainer rollers 96 and 98 are employed to bear against the outside surfaces 99a and 99b of the barrels 26 and 28 to maintain the proper position of them on the rollers 66, 88, 90, 92 and 94. The retainer rollers 96 and 98 are mounted on pivotal carriages 100 and 102 which are spring loaded by springs 104 and 106 to either of the two positions shown in FIG. 3, with the position of carriage 100 being in the barrel retaining position and the position of carriage 102 being in the release position whereby the barrel 30 can be removed and replaced for maintenance purposes.

Sliding contacts 108 and 110 are provided in position to contact the barrels 28 and 30 when they are in their retained position. The contacts 108 and 110 feed the required voltage potential thereto through wires 112 and connect to a potential source V.

When placed in operation the barrels 28 and 30 of present apparatus 10 are loaded with workpieces 14 through the vacuum lock 16 and the bifurcated chute 26. Once the workpieces are retained in the barrels 28 and 30 and a suitable inert gas at a reduced pressure environment is present within the chamber 12, a high D.C. voltage is applied between the barrels 28 and 30 and an anode comprised of a plurality of evaporator boats 114, which are located parallel to the barrels 28 and 30, adjacent their lower inner quadrants. The barrels are then counterrotated in directions so that the upward-going portions of the barrels 28 and 30 are closer to each other than the downward rotating portions thereof. This causes the workpieces 14 to climb the sides of the barrels 28 and 30 which are relatively close to the evaporator boats 114. At this point, some of the inert gas within the chamber 12 is ionized and accelerated toward the barrels 28 and 30 and the workpieces therein. These ions bombard the workpieces and scrub and clean the surfaces of the workpieces which are to be plated. As this ionized gas bombardment is continuing, the boats 114 are resistively heated until the plating material therein begins to evaporate. The glow discharge ionizes a portion of the evaporating plating material and these ionized atoms are accelerated toward the barrels 28 and 30 and the workpieces 14 by the direct current potential applied between the boats 114 and the barrels 28 and 30. Collisions between accelerated ions and molecules of the evaporated plating material cause both to be deposited. The ionized gas bombardment of the barrels and the workpieces continues during the deposition and the rate of evaporation of the plating material from the boats 114 is increased until the plating rate exceeds the rate at which material is being removed from the workpieces by the ionized gas bombardment. Since the location of the boats 114 is along a line generally parallel to and closely adjacent the area of the barrels 28 and 30 in which the workpieces tend to congregate when the barrels are being rotated, a large proportion of the plating material ultimately ends up on the workpieces and the barrels, and little energy is wasted in evaporating or throwing the plating material in the areas where there are no workpieces. During this period the boats 114 are continuously supplied plating material through feed conduits 116 and their drive mechanism 118 shown in FIG. 4. The electrical power for resistively heating the boats 114 and the mechanical power for the drive mechanism 118 are normally provided through the outlet end 119 of the chamber as shown in FIG. 4. The mechanism 118 and the boats 114 are supported on a table 120 which can be moved in a longitudinal direction along rails 122 and 124 by means of wheels 126 provided for that purpose. When the chamber 12 is opened for maintenance purposes, normally the outlet end 119 is removed first with the table 120 and the boats 114 being removable therewith.

Once the workpieces 14 have been sufficiently plated, the boats 114 are allowed to cool and the potential between the boats 114 and the barrels 28 and 30 is removed. Thereafter, the handle 32 is turned in a direction which allows the downward tilting of the outlet ends of the barrels 28 and 30 as shown in FIG. 5. As the barrels 28 and 30 with their shields 56, 58 and 48 gradually rotate into a tilted position outwardly extending abutment portions 130 and 132 of the retainers 80 and 82 come in contact with a horizontal bar abutment member 134 provided for that purpose. The bar, which is removably held in the chamber 12 by bolts 136, engages the portions 130 and 132 so that they lift with respect to the descending barrels 28 and 30 thereby lifting the retainers 80 and 82 and allowing escape of the workpieces 14 within the barrels 28 and 30. The barrels 28 and 30 are rotated in their normal directions which causes the parts to gradually fall out the ends thereof into the chutes 34 and 36 where they can be removed through the vacuum lock 18 without disturbing the atmosphere in the chamber 12. The chutes 34 and 36 can be supported for removal by the bar 134 as shown in FIG. 1. Once the handle 32 has been properly turned to return the barrels 28 and 30 to the positions shown in FIG. 2, the apparatus 10 is thereafter ready for the next cycle.

Thus, there has been shown and described novel apparatus for efficiently plating parts of many sizes using an ion vapor deposition process which fulfills all the objects and advantages sought therefor. Many changes, modifications, variations and other uses and applications of the subject invention will, however, become apparent to those skilled in the art after considering this specification and the accompanying drawings. All such changes, modifications, alterations and other uses and applications which do not depart from the spirit and scope of the invention are deemed to be covered by the invention which is limited only by the claims that follow.

What is claimed is:
1. An apparatus for plating articles including:

means forming an enclosed chamber in which the establishment of a desired reduced pressure environment is possible;

support means within said chamber, said support means including a first portion fixedly connected to said chamber forming means, a second portion hingedly connected to said first portion and a pair of elongated inner shields connected to and extending sidewardly from said support means second portion;

a pair of article supporting open mesh barrels of generally cylindrical configuration, said barrels being spaced generally parallel from each other and supported for axial rotation by said inner shields which are positioned therein;

drive means connected to rotate said barrels so that adjacent portions thereof travel upwardly and distant portions thereof travel downwardly; and means for supplying plating material, said supply means being oriented adjacent the lower adjacent quadrants of said barrels and along a line generally parallel to the axes of said barrels.

2. The apparatus defined in claim 1 wherein said support means further include:

a drive mechanism connected to said first and second portions thereof capable of varying the angular relationship therebetween so said barrels can be tilted from horizontal for unloading of articles.

3. The apparatus defined in claim 2 wherein said inner shields include:

electrically insulated rollers to support said barrels; and electrically insulated retainers positioned at the ends of said barrels opposite from said support means second portion, said retainers each having an article retaining position and an article releasing position.

4. The apparatus defined in claim 3 wherein said retainers are pivotally connected to said inner shields and each includes an abutment portion thereon, said chamber forming means including an abutment member positioned to engage said abutment portions of said retainers, whereby said barrels and inner shields are tiltable to an inclined position by said drive mechanism, said tilting causing said abutment of said abutment portions and member so that said retainers are moved with respect to said barrels to their article releasing positions.

5. The apparatus defined in claim 4 wherein said enclosed chamber includes vacuum lock means for transferring articles in and out of said chamber without substantially disturbing the reduced pressure environment therewithin.

6. The apparatus defined in claim 5 wherein said barrels have input ends adjacent said support means and opposite output ends, said vacuum lock means including a pair of chutes positioned adjacent the output ends of said barrels to guide said articles into said lock means.

7. The apparatus defined in claim 1 further including:

at least one outer shield covering an upper portion of said barrels, said outer shield being removably connected on one end to said support means second portion and one the other to said inner shields.

* * * * *